United States Patent
Baker

(10) Patent No.: US 6,577,525 B2
(45) Date of Patent: Jun. 10, 2003

(54) SENSING METHOD AND APPARATUS FOR RESISTANCE MEMORY DEVICE

(75) Inventor: R. Jacob Baker, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 34 days.

(21) Appl. No.: 09/939,655

(22) Filed: Aug. 28, 2001

(65) Prior Publication Data

US 2003/0043616 A1 Mar. 6, 2003

(51) Int. Cl.[7] .............................................. G11C 11/00
(52) U.S. Cl. ........................................ 365/148; 365/158
(58) Field of Search ................................ 365/148, 158, 365/171, 173, 207, 209

(56) References Cited

U.S. PATENT DOCUMENTS 6,128,239 A    10/2000  Perner ......................... 365/209
6,256,247 B1 * 7/2001  Perner ......................... 365/148
6,317,376 B1 * 11/2001 Tran et al. .................... 365/158

* cited by examiner

Primary Examiner—Richard Elms
Assistant Examiner—Anh Phung
(74) Attorney, Agent, or Firm—Dickstein Shapiro Morin & Oshinsky LLP

(57) ABSTRACT

An MRAM memory integrated circuit is disclosed. Resistance, and hence logic state, is determined by discharging a first charged capacitor through an unknown cell resistive element to be sensed at a fixed voltage, and a pair of reference capacitors. The rate at which the parallel combination of capacitors discharge is between the discharge rate associated with a binary '1' and '0' value, and thus offers a reference for comparison.

35 Claims, 7 Drawing Sheets

SENSING METHOD AND APPARATUS FOR RESISTANCE MEMORY DEVICE

FIELD OF THE INVENTION

The present invention relates to the field of resistor-based memory circuits. More particularly, it relates to a method for precisely sensing the resistance value of a resistor-based memory cell, for example, a Magnetic Random Access Memory (MRAM) magnetic memory cell.

BACKGROUND OF THE INVENTION

A resistor-based memory such as a magnetic random access memory (MRAM) typically includes an array of resistor-based magnetic memory cells. The logic state of such a magnetic memory cell is indicated by its resistance. One resistance value, e.g., the higher value, may be used to signify a logic high while another resistance value, e.g., the lower value, may be used to signify a logic low. The value stored in each memory cell can be determined by measuring the resistance value of the cell to determine whether the cell corresponds to a logic high or low. Such direct measurements are often difficult to simply and easily implement and require a number of comparators which increases the cost and size of the memory circuit. A simplified, more reliable method of sensing the resistance value of a resistor-based memory cell is desired.

SUMMARY OF THE INVENTION

The present invention provides a simple and reliable method and apparatus for sensing the logic state of a resistor-based memory cell. Resistance is measured by first charging a first capacitor to a predetermined voltage, discharging the first capacitor through a resistance to be measured while discharging a second capacitor through an associated reference resistance of known value and comparing the discharge characteristics e.g. the discharge voltage of two capacitors to determine a value of resistance to be measured relative to the reference resistance.

In one exemplary embodiment, a pair of second capacitors are used, each discharging through an associated reference resistance, one having a value corresponding to one possible resistance value of the resistance to be measured and the other having a value corresponding to another possible resistance value of the resistance to be measured. The combined discharge characteristics of the pair of second capacitors, e.g. an average of the discharge capacitor voltage, is compared with the discharge characteristics e.g. the discharge voltage of the first capacitor to determine a value of the resistance to be measured relative to an average value of the two reference resistances.

BRIEF DESCRIPTION OF THE DRAWINGS

The foregoing and other features and advantages of the invention will become more apparent from the detailed description of the exemplary embodiments of the invention given below with reference to the accompanying drawings in which.

DETAILED DESCRIPTION OF THE INVENTION

Figure 1:
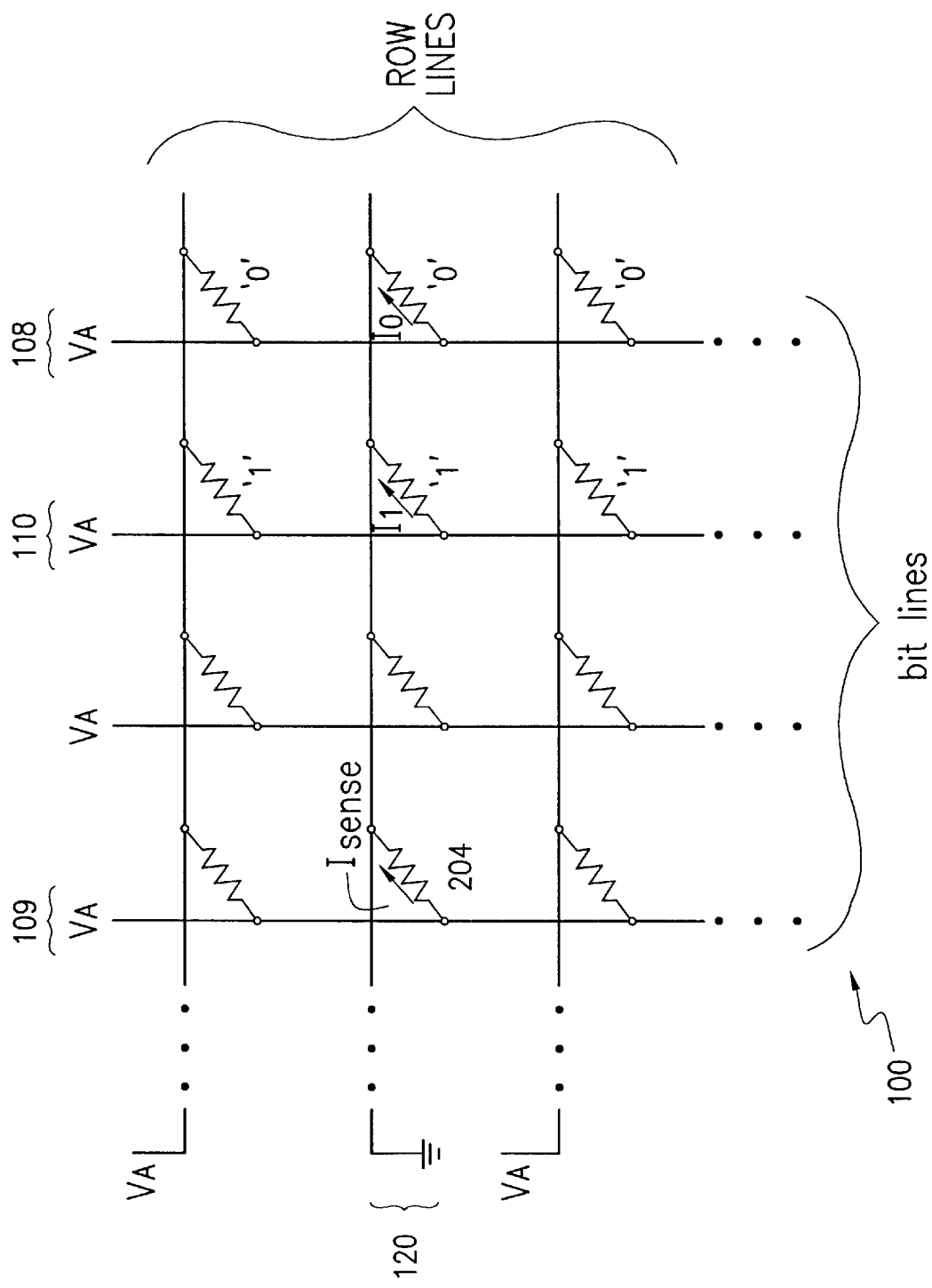
FIG. 1 shows the invention employed in an exemplary MRAM device.

A portion of a MRAM array 100 with which the present invention may be used is shown in FIG. 1. The logical state of an MRAM memory element e.g. 204 is represented by the resistance of that element. In the present invention, resistance is determined by holding a voltage constant across a cell's resistive element and comparing a voltage produced by the current that flows through that resistive element with a voltage produced by the current flow through a known reference resistance. To read the binary state of a memory cell element, the absolute magnitude of resistance need not be known; only whether the resistance is above or below a value that is intermediate to the logic high and logic low values. Accordingly, to provide a reference current flow for comparison purposes the resistive elements within rightmost column 108 of array 100 are preprogrammed to hold all '0' values, while those within column 110 immediately to its left are preprogrammed to hold all '1' values. The current flowing through these two columns when a particular row line of the array 100 is selected by grounding a rowline, e.g. rowline 120, will heretofore be designated as $I_0$ and $I_1$, as shown in FIG. 1.

During the reading process, all column and row lines are driven with the same array voltage $V_A$, except for the one row line, e.g. 120 that is desired to be read. That row line 120 is driven to ground. When row 120 is grounded, a resistive element of a selected column, e.g. column 109, can be read by a sensing circuit 300 described below. As shown in FIG. 1, both ends of all resistive elements not being measured are maintained at the same potential, $V_A$. Thus, unwanted current flow through these resistive elements due to "sneak" resistance is negligible. A current $I_{sense}$ flows through the grounded resistive element of a selected column within the row 120 for allowing measurement of the resistance by the sensing circuit 300 (not shown in FIG. 1).

Figure 2:
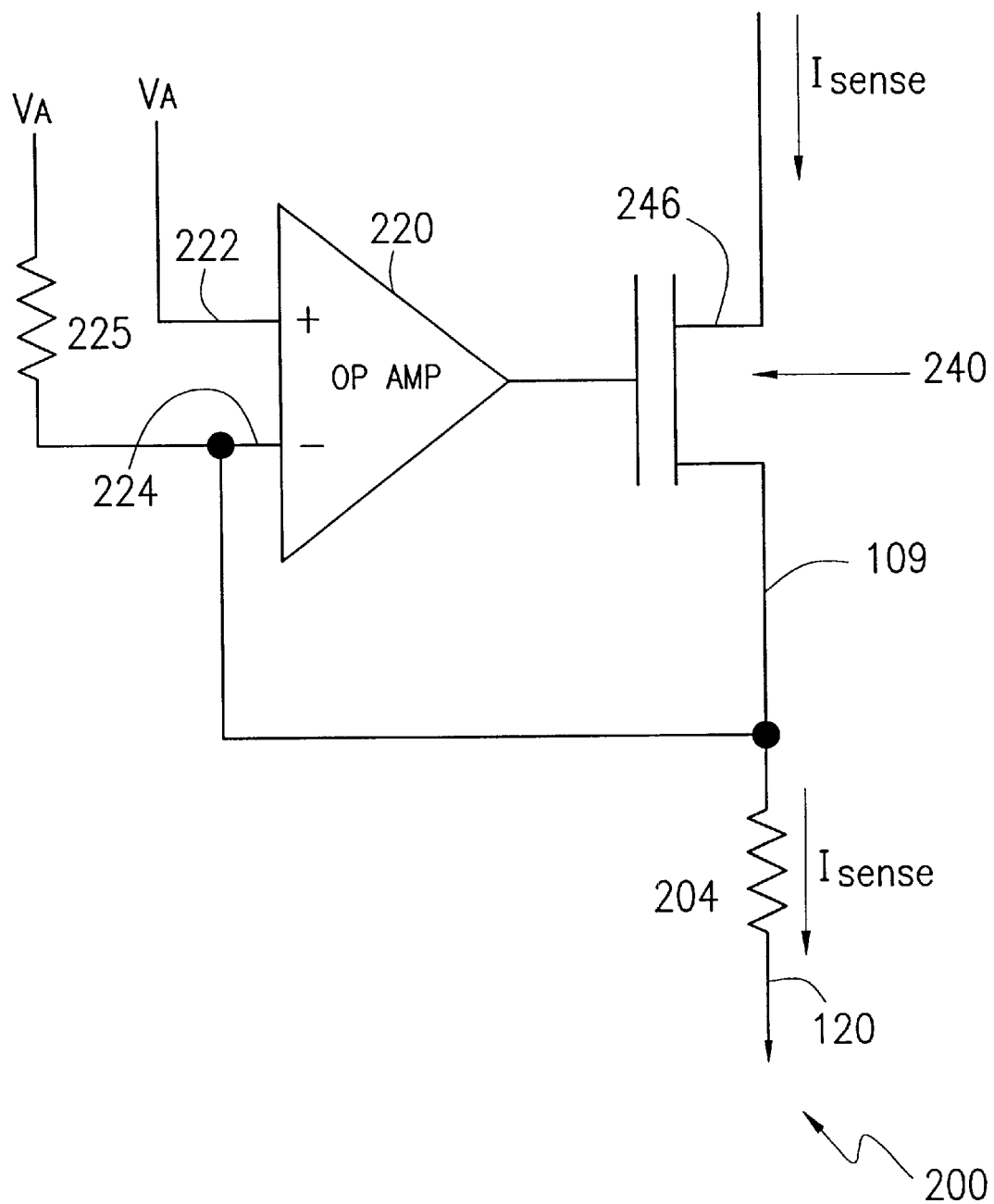
FIG. 2 shows a schematic diagram of one aspect of the invention.

FIG. 2 shows a circuit 200 for regulating current through and voltage across a resistive element 204 being measured. An operational amplifier 220 has one terminal 222 connected to $V_A$, while the other terminal 224 is connected to the column line 109 for the resistance element 204 which is being sensed. The gate 242 of NMOS transistor 240 is connected to the output of operational amplifier 220. The source 246 of transistor 240 is connected to one terminal of the resistive element 204 being read, while the other terminal of resistive element 204 is driven to ground by the grounding of wordline 120 described earlier. Operational amplifier 220 and transistor 240 act in concert to keep one terminal of resistive element 204 stably at $V_A$ despite the fact that the other terminal is grounded. In this way, $I_{sense}$ can flow through transistor 240 and resistive element 204, while current lost through sneak resistor 225 is minimized.

Figure 3:
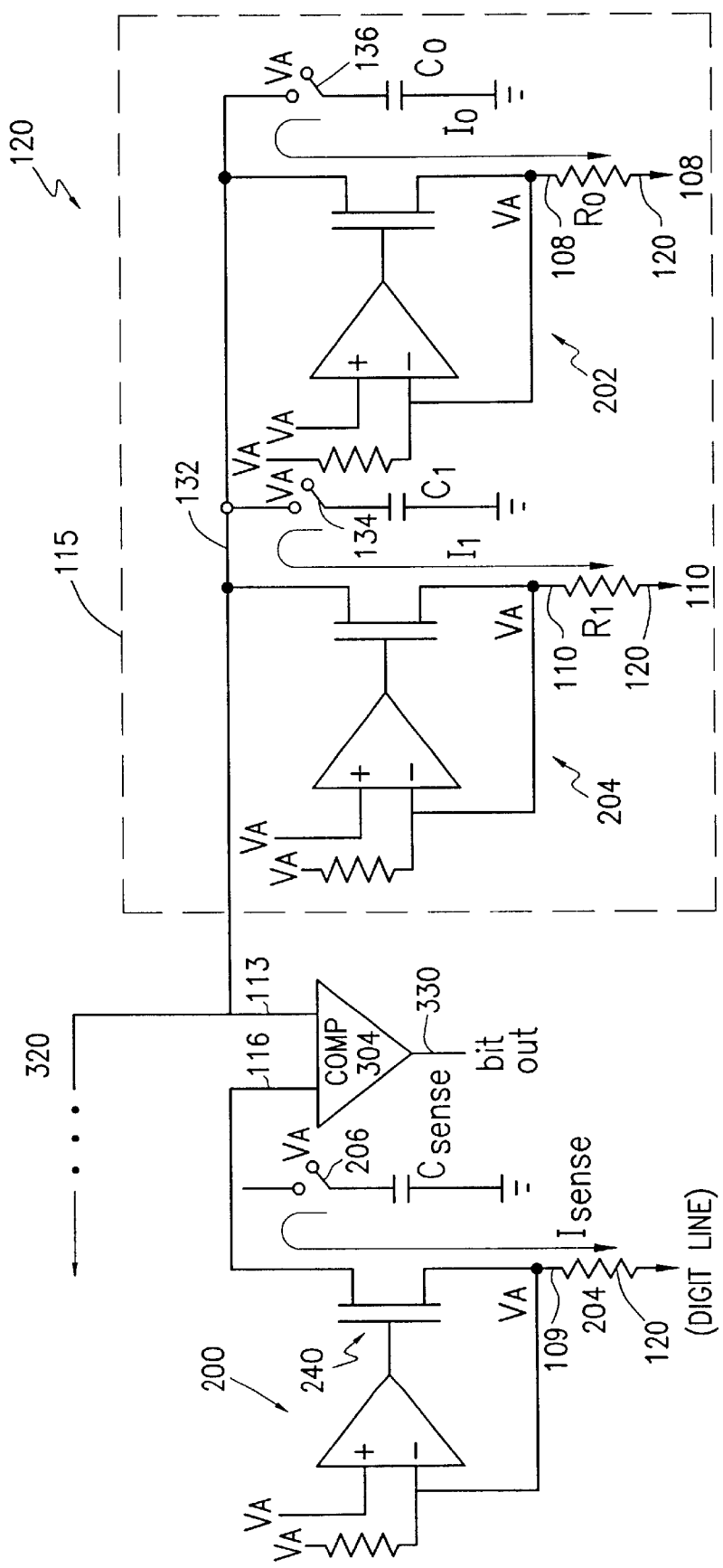
FIG. 3 shows a schematic diagram of an additional aspect of the invention.

To sense the amount of resistance of resistance element 204, the current flow through resistance element 204 must be determined, since the voltage across resistance element 204 is held constant at $V_A$. FIG. 3 shows how the current regulating circuit 200 combined with a voltage comparator 304, and a reference voltage generating circuit 115 to provide a method and apparatus for determining current flow through sensed resistance element 204. As shown in FIG. 3, the active wordline 120 is also connected to reference resistance elements R0 and R1 associated with column lines 108 and 110, which are pre-set to '0' and '1' resistance values respectively. Each column line of array 110 which has resistance elements which may be written to or read has its own sensing circuit and comparator which are active when the column is addressed to select with the grounded rowline, which resistive memory element within a given row is being read. Thus, connection line 320 shows how the reference voltage generating circuit 115 is connected to other columns of array 100. As noted, each column line (e.g. 109 shown in FIG. 3.) has a voltage having a reference input 113 and sensed voltage input 116.

The reference voltage generating circuit 115 includes a first 202 and second 204 regulating circuit each associated with a respective reference resistance element 108, 110. These regulating circuits respectively hold the voltage across reference resistors elements 108 and 110 at $V_A$ in the manner described above with reference to FIG. 2. The resistance elements $R_0$, $R_1$ have respective known resistance values corresponding to one of the logic states of a memory element and the other corresponding to the other possible logic state. The reference voltage generating circuit 115 also includes capacitors $C_1$ and $C_0$ respectively associated with the reference resistance elements $R_0$ and $R_1$. Each of the capacitors $C_1$ and $C_0$ has one lower terminal grounded and the other upper terminal connectable to a common voltage line 132 through a respective switch element 134, 136. The switch elements 134, 136 are configured to connect the upper terminals of the capacitors $C_1$, $C_0$ to either a source of voltage $V_A$ or to the common voltage line 132. The common voltage line 132 is connected to the reference voltage input 113 of comparator 304.

As noted, the comparator 304 also has a voltage input 116. This is connected through another switch element 206 to an upper terminal of a sensing capacitor $C_{sense}$, the lower terminal of which is grounded. Switch element 206 is adapted to connect the upper terminal of comparator $C_{sense}$ to either a source of voltage $V_A$ or to the input 116 of comparator 304. The input 116 is also connected to the upper (drain) terminal of transistor 240 which has it source terminal connected to the resistance element 204, the resistance of which is to be measured.

All of the switch elements 134, 136 and 206 switch together to either connect the upper terminals of capacitors $C_{sense}$, $C_1$, an $C_0$ to the voltage $V_A$, or to connect the upper terminal of capacitor $C_{sense}$ to input 116 and the upper terminals of capacitors $C_1$ and $C_0$ to common voltage line 132. When the switch elements are in the latter condition the capacitors $C_{sense}$, $C_1$, and $C_0$ are connected in a way which provides the current flows I0, I1 and Isense through respective resistance elements R0, R1 and 204.

The circuit of FIG. 3 operates as follows. Capacitors $C_{sense}$, $C_1$, and $C_0$ are first fully charged to $V_A$ by switch elements 134, 136 206 simultaneously connecting their upper terminals to a $V_A$ voltage source. After the capacitors $C_{sense}$, $C_1$, and $C_0$ are charged the switch elements 134, 136, and 206 are simultaneously operated to connect the upper terminal of capacitor $C_{sense}$ to input 116 and the upper terminal of capacitors $C_0$ and $C_1$ to the common voltage line 132. As a result all three capacitors begin discharging in unison in the direction symbolized by current flow arrows $I_{sense}$, $I_1$, and $I_0$. The rate at which the capacitors $C_1$ and $C_0$ discharge is determined by the resistance of the path through which they discharge.

Figure 4:
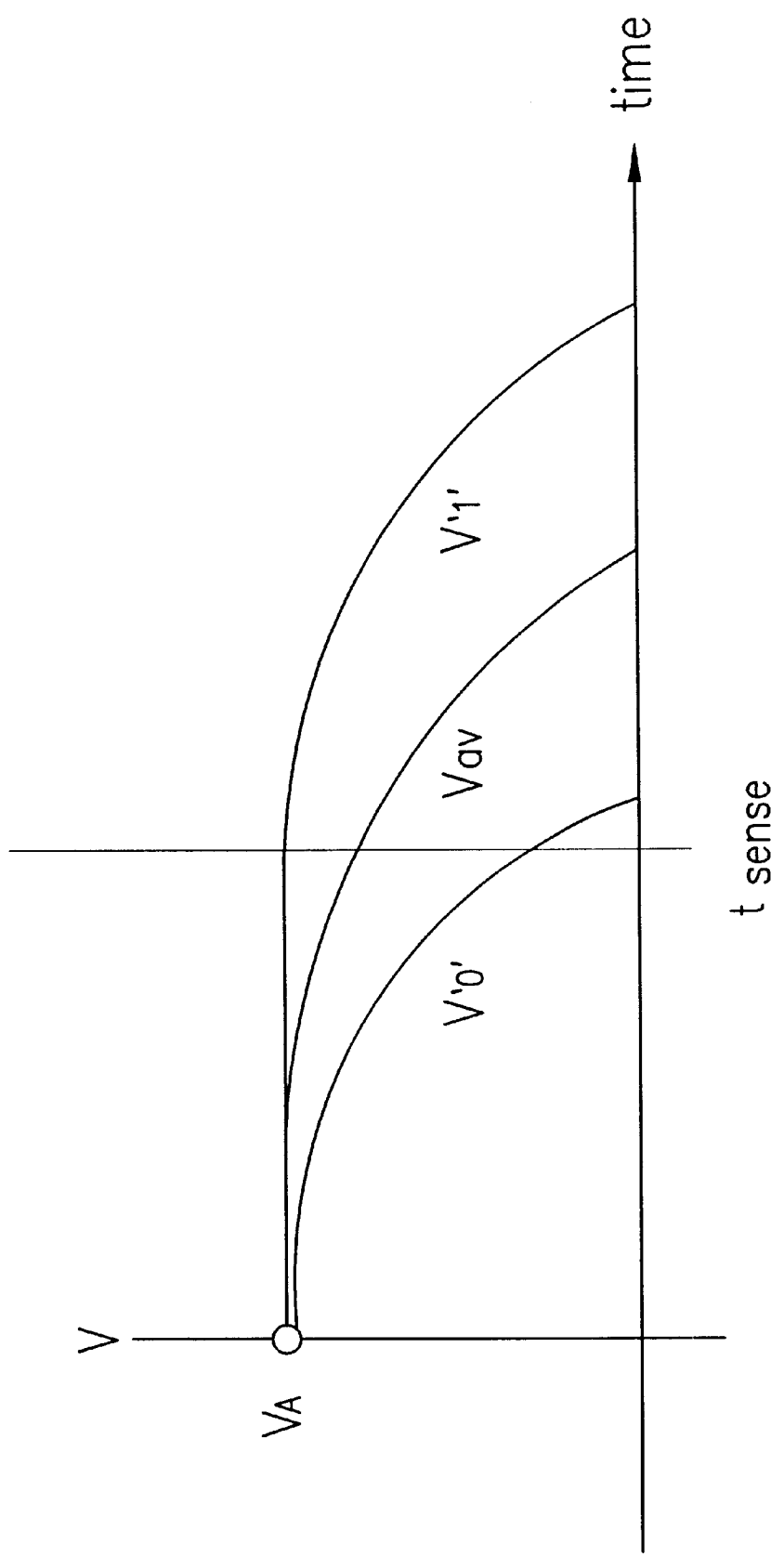
FIG. 4 shows the discharge rate characteristics of capacitors employed in the invention.

The capacitor $C_{sense}$, will also discharge through resistance element 204 and the decaying voltage on capacitor 204 is applied to sense voltage input 116 of comparator 304. The discharge of both capacitors simultaneously will provide a reference voltage on voltage line 132 which is the average voltage instantaneously on capacitors $C_1$, $C_0$. Thus, as capacitors $C_1$ and $C_0$ discharge, this average voltage will decay. This average voltage is applied to the reference voltage input of comparator 304. The capacitor $C_{sense}$, will discharge significantly faster if resistance element 204 has a resistance representing a '0' value (e.g. 950 KΩ) than a resistance representing a '1' value (e.g. 1 MΩ). Consequently, the voltage on $C_{sense}$ will discharge either more slowly or more quickly than the average voltage discharge of $C_1$ and $C_0$, hereafter noted as $V_{sense}$. The combined average voltage across capacitors $C_1$ and $C_0$ as seen by comparator 304 decays with time as shown by $V_{av}$ in FIG. 4. $V_{av}$ falls between the decaying voltage on capacitor $C_{sense}$ when a logical '1' and a '0' resistance is set in resistance element 204. Because the resistive memory element 204 being sensed will either store a 1 or a 0, its discharge voltage $V_{sense}$ will (intentionally) never be equal to $V_{av}$, instead $V_{sense}$ will always be measurably higher or lower than $V_{av}$. Accordingly, the difference between the sensed and reference discharge voltages ($V_{sense}$ and $V_{av}$) will be compared by the comparator 304 at sense time $t_{sense}$, which will provide an electrical '1' or '0' output representing the stored logic value of resistance element 204.

Thus, determining whether a resistive memory element holds a '1' or a '0' does not require quantitatively measuring $V_{sense}$, instead, it is only necessary to compare $V_{sense}$ with $V_{av}$ using a comparator 304. A circuit for comparing $V_{sense}$ to $V_{av}$ can be achieved with less components than a circuit for quantitatively measuring $V_{sense}$. The frequency with which the voltages $V_{sense}$ and $V_{av}$ can be compared is limited only by the capacitance values of $C_0$, $C_1$, and $C_{sense}$ which must also produce an integrating effect across their respective resistance elements.

Figure 5:
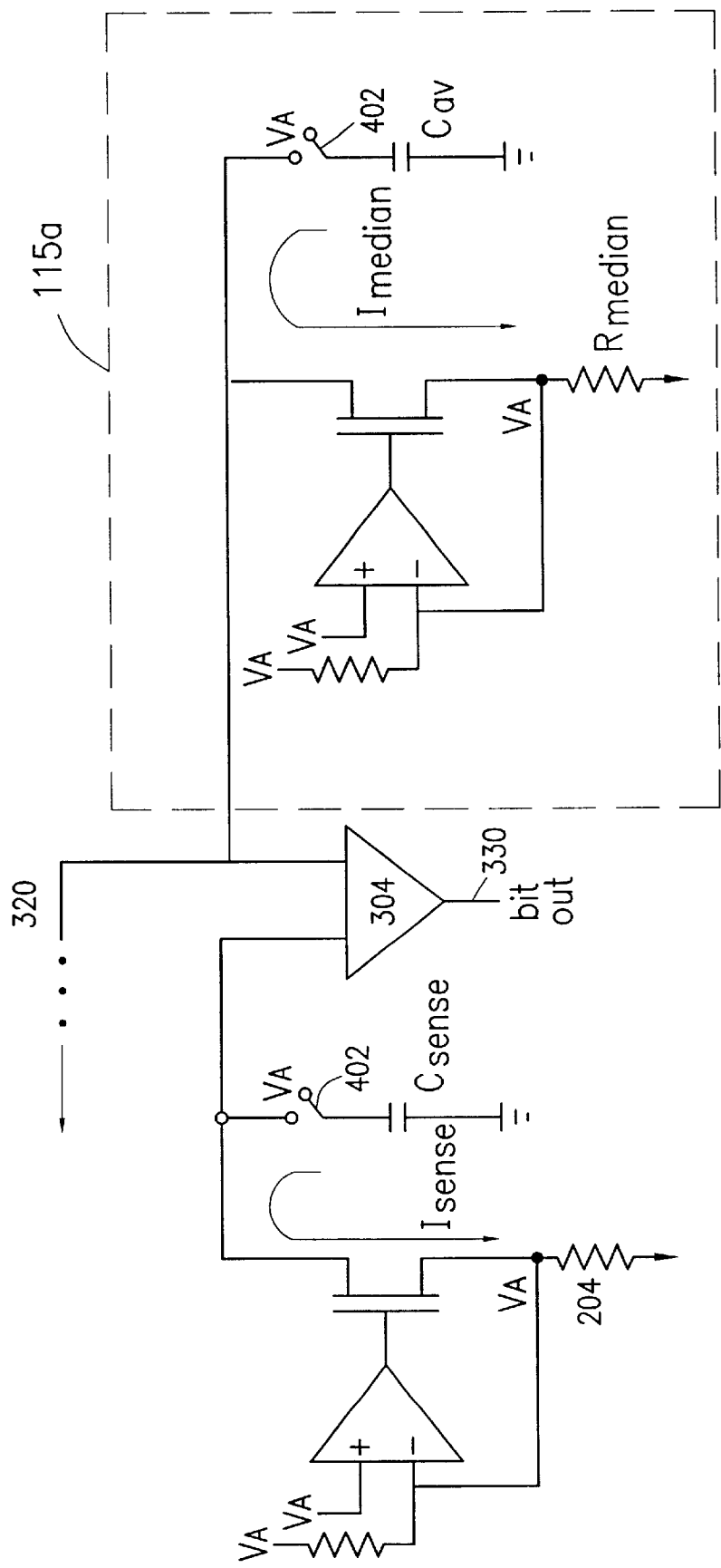
FIG. 5 shows a schematic diagram of an additional aspect of the invention.

FIG. 5 shows an alternative embodiment in which only a single capacitor $C_{av}$ is used in the reference voltage across 115a. In such an embodiment, the desired $V_{av}$ could be obtained by discharging capacitor $C_{av}$ across a single resistor $R_{median}$ of known value which lies between resistance values corresponding to a logical '0' and '1' value. For example, if 950 KΩ corresponds to a typical MRAM resistance for a binary '0', and 1 MΩ corresponds to the typical MRAM resistance for a binary '1', then a median resistance value is set for.example at 975 KΩ. By discharging capacitor $C_{av}$ across such a median resistance, a value for $V_{av}$ for comparison with $V_{sense}$ can be provided. In this embodiment, the $R_{median}$ resistance can be provided by using a single column, e.g. 108, of reference resistance elements in array 100 having this value, or dispensing with reference resistance element in the array in favor of an out-of array reference resistance element which has the $R_{median}$ value.

Figure 6:
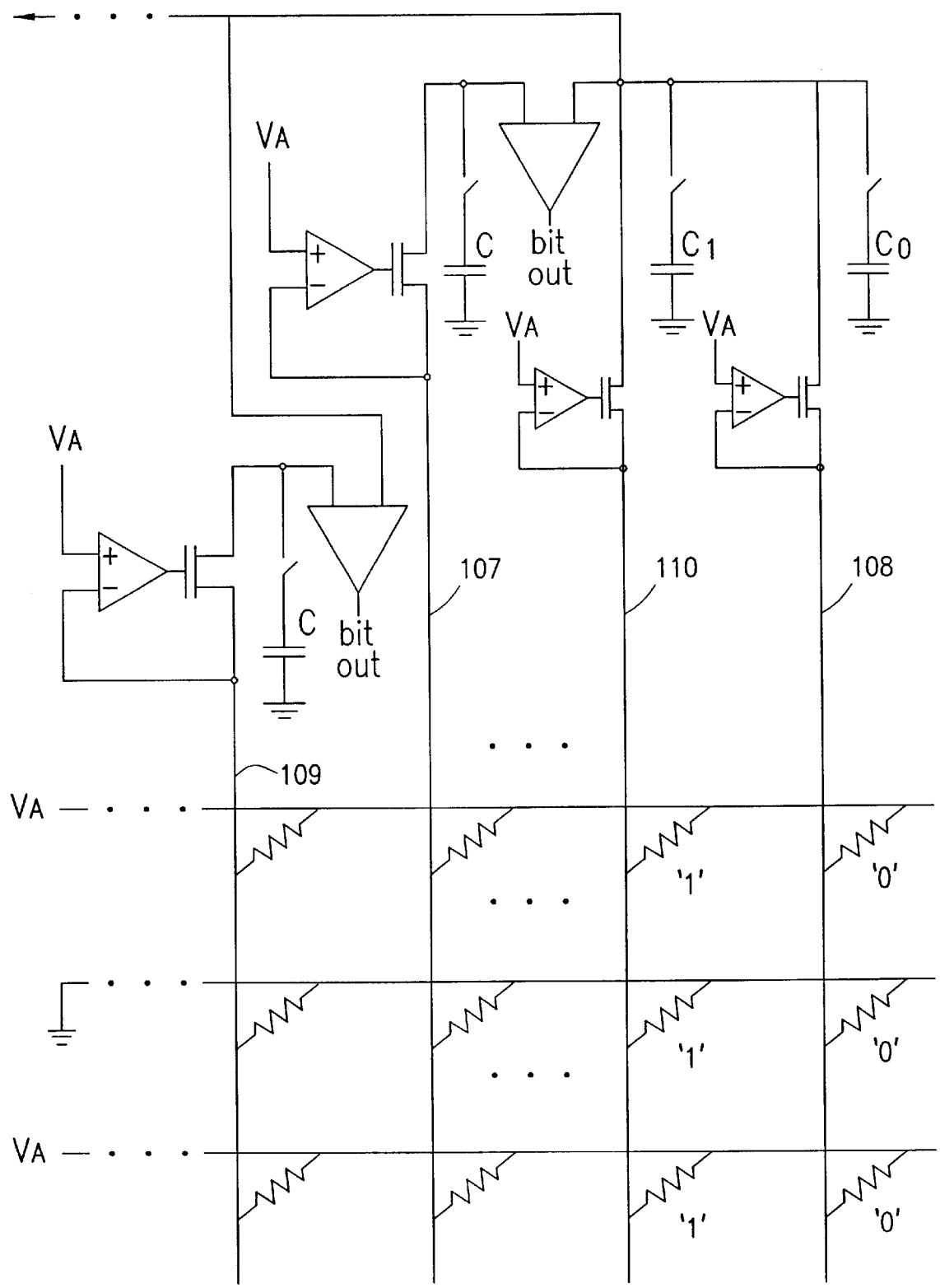
FIG. 6 shows a schematic diagram of an additional aspect of the invention.

FIG. 6 illustrates how the current regulating circuit 200 and sensing circuit 300 of the invention are arranged with a memory array 100. In FIG. 6, the columns which connect with storage resistive elements are labeled 107, 109, while the reference columns remain shown in 108, 110.

The sensing circuit 300 of the present invention compares two discharge voltages $V_{sense}$ and $V_{av}$ and immediately makes a determination which logical value to output on bit-out line 330. Thus, a method and apparatus for quickly measuring MRAM values while minimizing the number of necessary components is achieved.

Figure 7:
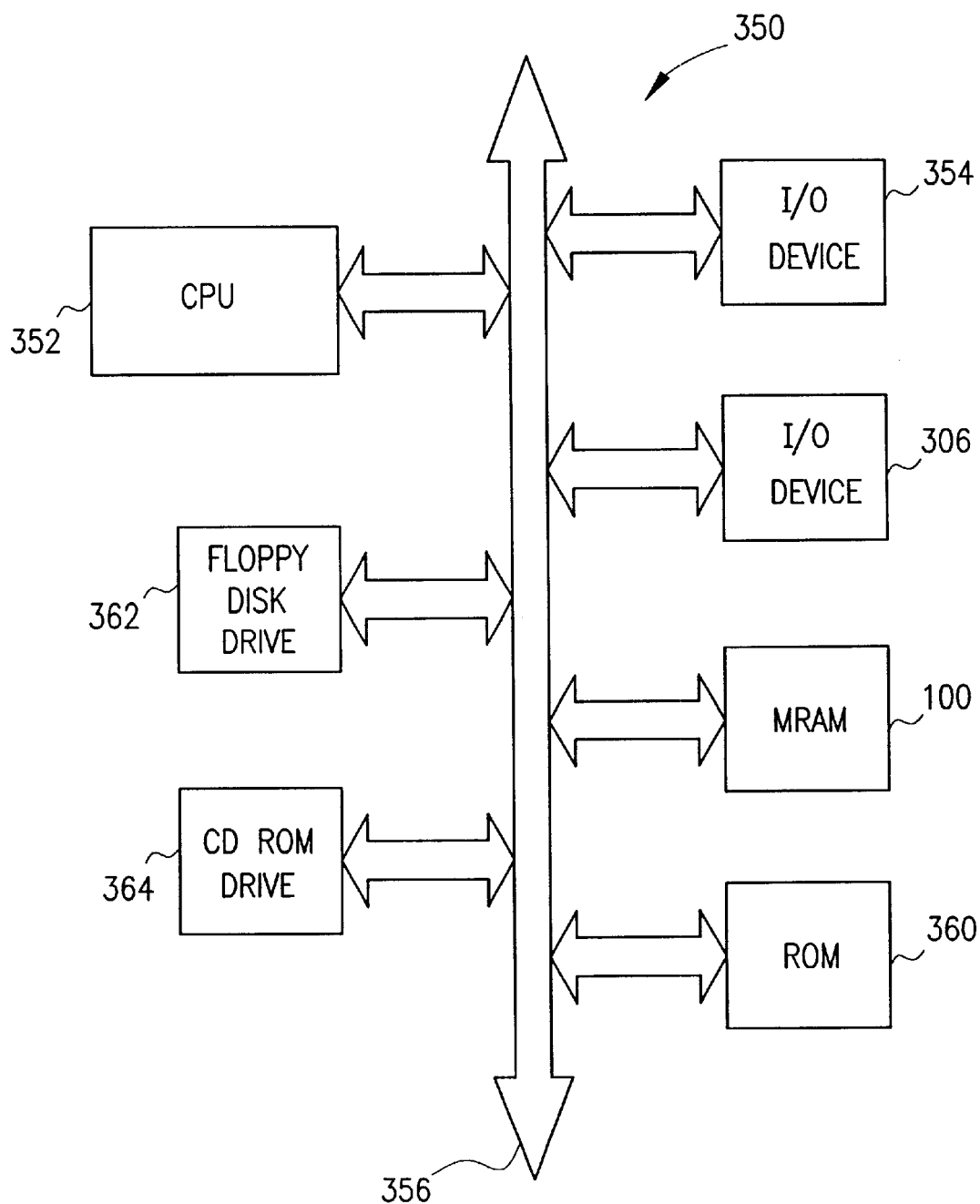
FIG. 7 shows the invention utilized in a computer system.
Figure 3:
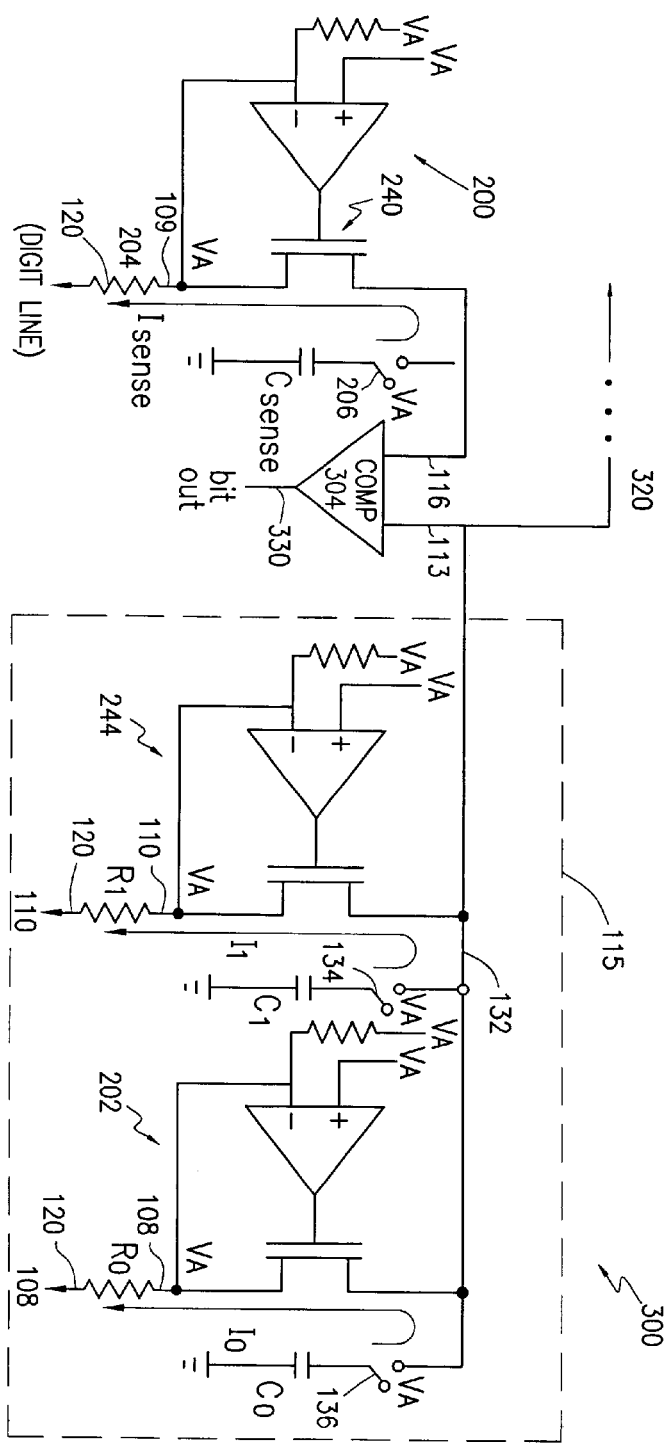

FIG. 7 is a block diagram of a processor-based system 350 utilizing a MRAM array 100 constructed in accordance with one of the embodiments of the present invention. The processor-based system 350 may be a computer system, a process control system or any other system employing a processor and associated memory. The system 350 includes a central processing unit (CPU) 352, e.g., a microprocessor, that communicates with the MRAM array 100 and an I/O device 354 over a bus 356. It must be noted that the bus 356 may be a series of buses and bridges commonly used in a processor-based system, but for convenience purposes only, the bus 356 has been illustrated as a single bus. A second I/O device 306 is illustrated, but is not necessary to practice the invention. The processor-based system 350 also includes read-only memory (ROM) 360 and may include peripheral devices such as a floppy disk drive 362 and a compact disk (CD) ROM drive 364 that also communicates with the CPU 352 over the bus 356 as is well known in the art.

While the invention has been described and illustrated with reference to specific exemplary embodiments, it should be understood that many modifications and substitutions can be made without departing from the spirit and scope of the invention. Accordingly, the invention is not to be considered as limited by the foregoing description but is only limited by the scope of the appended claims.

What is claimed is:

1. A resistance memory device, comprising:
   memory array comprising a plurality of row lines, a plurality of column lines, and a plurality of resistive elements, each resistive element connected to a row line and a column line, said resistive elements having one of a first resistance value which represents a first logical state and a second resistance value which represents a second logical state;
   a sensing circuit for sensing the resistance value of a selected resistance element, said sensing circuit comprising:
      a first capacitor and at least one second capacitor;
      a charging circuit for charging said capacitors to a predetermined voltage value;
      a reference resistance element;
      a first discharge circuit for discharging said first capacitor through said selected resistive element and a second discharge circuit for discharging said at least one second capacitor through said reference resistance element; and
      a comparison circuit for comparing a discharge characteristic of said first capacitor with a discharge characteristic of said at least one second capacitor.

2. The memory device of claim 1, wherein said at least one second capacitor comprises a first and a second reference capacitor and said associated reference resistance clement comprises first and a second resistance elements respectively associated with said first and second reference capacitances having resistance values respectively corresponding to a binary '1' value and a binary '0' value, wherein said first reference capacitor discharges through said first resistance element, and said second reference capacitor discharges through said second resistance element.

3. The memory device as in claim 1 or 2 wherein said comparison circuit compares the voltage levels of said first and at least one second capacitor during the discharging of said capacitors.

4. The memory device of claim 1, further comprising:
   a regulation circuit for maintaining a predetermined voltage across said selected resistance element and said reference resistance element during discharge of said capacitors.

5. The memory device of claim 4 wherein said regulation circuit comprises a first regulator associated with said selected resistance element and at least one second regulator associated with said reference resistance.

6. The memory device of claim 1, wherein said charging circuit further comprises a switch circuit for selectively connecting said first and at least one second capacitor to a source providing said predetermined voltage value and resistance.

7. The memory device of claim 6 wherein said at least on second capacitor comprises a first reference capacitor and said associated reference resistance element comprises a first reference resistance element, said first reference resistance element having a resistance value which resides between two possible resistance values for said selected resistance element, said comparison circuit comprising a discharging voltage of said first reference capacitor with a discharge voltage of said first capacitor.

8. The memory device of claim 1 wherein said memory array is an MRAM memory array.

9. An MRAM memory device, comprising:
   a memory array comprising a plurality of row lines, a plurality of column lines, and a plurality of resistive elements, each resistive element connected to a row line and a column line, said resistive elements having one of a first resistance value which represents a first logical state and a second resistance value which represents a second logical state;
   a sensing circuit for sensing the resistance value of a selected resistance element, said sensing circuit comprising:
      a first capacitor and at least one second capacitor;
      a charging circuit for charging said capacitors to a predetermined voltage value;
      a reference resistance element;
      a first discharge circuit for discharging said first capacitor through said selected resistive element and a second discharge circuit for discharging said at least one second capacitor through said reference resistance element; and
      a comparison circuit for comparing a discharge characteristic of said first capacitor with a discharge characteristic of said at least one second capacitor.

10. The MRAM memory device of claim 9, wherein said at least one second capacitor comprises a first and a second reference capacitor and said associated reference resistance element comprises first and a second resistance elements respectively associated with said first and second reference capacitances having resistance values respectively corresponding to a binary '1' value and a binary '0' value, wherein said first reference capacitor discharges through said first resistance element, and said second reference capacitor discharges through said second resistance element.

11. The MRAM memory device as in claim 9 or 10 wherein said comparison circuit compares the voltage levels of said first and at least one second capacitor during the discharging of said capacitors.

12. The MRAM memory device of claim 9, further comprising:
   a regulation circuit for maintaining a predetermined voltage across said selected resistance element and said reference resistance element during discharge of said capacitors.

13. The MRAM memory device of claim 12 wherein said regulation circuit comprises a first regulator associated with said selected resistance element and at least one second regulator associated with said reference resistance.

14. The MRAM memory device of claim 9, wherein said charging circuit further comprises a switch circuit for selectively connecting said first and at least one second capacitor to a source providing said predetermined voltage value and resistance.

15. The MRAM memory device of claim 14 wherein said at least on second capacitor comprises a first reference capacitor and said associated reference resistance element comprises a first reference resistance element, said first reference resistance element having a resistance value which resides between two possible resistance values for said selected resistance element, said comparison circuit comprising a discharging voltage of said first reference capacitor with a discharge voltage of said first capacitor.

16. A method of reading a resistance array, comprising a plurality of column lines, a plurality of row lines, and plurality of resistance elements each connected to a column and row line:

grounding a selected row of said arrays which contain resistance elements to be read;

holding all other rows of said array at a specific voltage;

pre-setting the resistance of a first resistance element connected to said grounded row and associated with a first reference column time to hold a binary '1' resistance value;

pre-setting the resistance of a second resistance element connected to said grounded row and associated with a second reference column line to hold a binary '0' resistance value;

charging a first capacitor associated with a column line of said selected resistance element to a first voltage value;

charging first and second reference capacitors respectively associated with said first and second reference resistance elements to said first voltage value;

discharging said first capacitor through said selected resistance element while discharging said first and second reference capacitors respectively through said first and second resistance elements;

comparing the discharge voltage of said first capacitor with a discharge voltage formed by the discharge rates of said first and second reference capacitors;

determining the binary value held within said selected resistance element as a result of said comparison.

17. The method of claim 16, further comprising:

holding one terminal of said selected resistance element to be read at a constant voltage using the discharge of said first capacitor.

18. The method of claim 16, further comprising:

holding one terminal of first and second reference resistance elements at said constant array voltage using the discharge of said first and second reference capacitors.

19. A method of reading a resistance array, comprising a plurality of column lines, a plurality of row lines, and plurality of resistance elements each connected to a column and row line:

grounding a selected row of said arrays which contain resistance elements to be read;

holding all other rows of said array at a specific voltage;

pre-setting the resistance of a reference resistance element connected to said grounded row and associated with a first reference column line to reside directly between a binary '1' and a binary '0' resistance value;

charging a first capacitor associated with a column line of said selected resistance element to a first voltage value;

charging a first reference capacitor associated with said reference resistance element to said first voltage value;

discharging said first capacitor through said selected resistance element while discharging said first reference capacitor through said reference resistance element;

comparing the discharge voltage of said first capacitor with a discharge voltage formed by the discharge rates of said first reference capacitor;

determining the binary value held within said selected resistance element as a result of said comparison.

20. The method of claim 19, further comprising:

holding one terminal of said selected resistance element to be read at a constant voltage using the discharge of said first capacitor.

21. The method of claim 19, further comprising:

holding one terminal of first and second reference resistance elements at said constant array voltage using the discharge of said first and second reference capacitors.

22. An processor circuit, comprising:

a CPU;

an resistive memory circuit, further comprising:

a memory array comprising a plurality of row lines, a plurality of column lines, and a plurality of resistive elements, each resistive element connected to a row line and a column line, said resistive elements having one of a first resistance value which represents a first logical state and a second resistance value which represents a second logical state;

a sensing circuit for sensing the resistance value of a selected resistance element, said sensing circuit comprising:

a first capacitor and at least one second capacitor;

a charging circuit for charging said capacitors to a predetermined voltage value;

a reference resistance element;

a first discharge circuit for discharging said first capacitor through said selected resistive element and a second discharge circuit for discharging said at least one second capacitor through said reference resistance element; and a comparison circuit for comparing a discharge characteristic of said first capacitor with a discharge characteristic of said at least one second capacitor.

23. The processor circuit of claim 22, wherein said at least one second capacitor comprises a first and a second reference capacitor and said associated reference resistance element comprises first and a second resistance elements respectively associated with said first and second reference capacitances having resistance values respectively corresponding to a binary '1' value and a binary '0' value, wherein said first reference capacitor discharges through said first resistance element, and said second reference capacitor discharges through said second resistance element.

24. The processor circuit as in claims 22 or 23 wherein said comparison circuit compares the voltage levels of said first and at least one second capacitor during the discharging of said capacitors.

25. The processor circuit of claim 22, further comprising:

a regulation circuit for maintaining a predetermined voltage across said selected resistance element and said reference resistance element during discharge of said capacitors.

26. The processor circuit of claim 25 wherein said regulation circuit comprises a first regulator associated with said selected resistance element and at least one second regulator associated with said reference resistance.

27. The processor circuit of claim 22, wherein said charging circuit further comprises a switch circuit for selectively connecting said first and at least one second capacitor to a source providing said predetermined voltage value and resistance.

28. The processor circuit of claim 27 wherein said at least on second capacitor comprises a first reference capacitor and said associated reference resistance element comprises a first reference resistance element, said first reference resistance element having a resistance value which resides between two possible resistance values for said selected resistance element, said comparison circuit comprising a discharging voltage of said first reference capacitor with a discharge voltage of said first capacitor.

29. An processor circuit, comprising:
   a CPU;
   an MRAM memory circuit, further comprising:
      a memory array comprising a plurality of row lines, a plurality of column lines, and a plurality of resistive elements, each resistive element connected to a row line and a column line, said resistive elements having one of a first resistance value which represents a first logical state and a second resistance value which represents a second logical state;
      a sensing circuit for sensing the resistance value of a selected resistance element, said sensing circuit comprising:
         a first capacitor and at least one second capacitor;
         a charging circuit for charging said capacitors to a predetermined voltage value;
         a reference resistance element;
         a first discharge circuit for discharging said first capacitor through said selected resistive element and a second discharge circuit for discharging said at least one second capacitor through said reference resistance element; and
         a comparison circuit for comparing a discharge characteristic of said first capacitor with a discharge characteristic of said at least one second capacitor.

30. The processor circuit of claim 29, wherein said at least one second capacitor comprises a first and a second reference capacitor and said associated reference resistance element comprises first and a second resistance elements respectively associated with said first and second reference capacitances having resistance values respectively corresponding to a binary '1' value and a binary '0' value, wherein said first reference capacitor discharges through said first resistance element, and said second reference capacitor discharges through said second resistance element.

31. The processor circuit as in claim 29 or 30 wherein said comparison circuit compares the voltage levels of said first and at least one second capacitor during the discharging of said capacitors.

32. The processor circuit of claim 29, further comprising:
   a regulation circuit for maintaining a predetermined voltage across said selected resistance element and said reference resistance element during discharge of said capacitors.

33. The processor circuit of claim 32 wherein said regulation circuit comprises a first regulator associated with said selected resistance element and at least one second regulator associated with said reference resistance.

34. The processor circuit of claim 29, wherein said charging circuit further comprises a switch circuit for selectively connecting said first and at least one second capacitor to a source providing said predetermined voltage value and resistance.

35. The processor circuit of claim 34 wherein said at least on second capacitor comprises a first reference capacitor and said associated reference resistance element comprises a first reference resistance element, said first reference resistance element having a resistance value which resides between two possible resistance values for said selected resistance element, said comparison circuit comprising a discharging voltage of said first reference capacitor with a discharge voltage of said first capacitor.

* * * * *

UNITED STATES PATENT AND TRADEMARK OFFICE
CERTIFICATE OF CORRECTION

PATENT NO. : 6,577,525 B2
DATED : June 10, 2003
INVENTOR(S) : R. J. Baker

It is certified that error appears in the above-identified patent and that said Letters Patent is hereby corrected as shown below:

Column 3,
Line 41, change "it" to -- its --

Column 4,
Line 13, change "$V_{sense}$," to -- $V_{av}$, --

Column 5,
Line 25, change "memory" to -- a memory --

Column 6,
Line 8, change "on" to -- one --

Column 7,
Line 5, change "on" to -- one --

Column 10,
Line 30, change "on" to -- one --

Signed and Sealed this

Twenty-third Day of September, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,577,525 B2
DATED : June 10, 2003
INVENTOR(S) : R.J. Baker

It is certified that error appears in the above-identified patent and that said Letters Patent is hereby corrected as shown below:

Drawings,
Figure 3, upper right, reads "120" should read -- 300 --
Figure 3, center reads "204" should read -- 244 --.

Column 3,
Line 15, reads "204" should read -- 244 --.

Signed and Sealed this

Twenty-fourth Day of August, 2004

JON W. DUDAS
*Director of the United States Patent and Trademark Office*